United States Patent
Sartore et al.

(10) Patent No.: US 10,241,702 B1
(45) Date of Patent: Mar. 26, 2019

(54) EXTENDING THE TIME FOR A MEMORY SAVE OPERATION BY REDUCING THE PEAK INSTANTANEOUS CURRENT DRAW

(71) Applicant: AgigA Tech Inc., San Diego, CA (US)

(72) Inventors: Ronald H Sartore, Valley Center, CA (US); Torry J Steed, San Diego, CA (US)

(73) Assignee: AgigA Tech Inc., San Diego, CA (US)

(*) Notice: Subject to any disclaimer, the term of this patent is extended or adjusted under 35 U.S.C. 154(b) by 0 days.

(21) Appl. No.: 15/721,510

(22) Filed: Sep. 29, 2017

(51) Int. Cl.
*G06F 1/3234* (2019.01)
*G06F 3/06* (2006.01)

(52) U.S. Cl.
CPC .......... *G06F 3/0625* (2013.01); *G06F 3/0634* (2013.01); *G06F 3/0653* (2013.01); *G06F 3/0688* (2013.01)

(58) Field of Classification Search
CPC .... G06F 3/0625; G06F 3/0688; G06F 3/0653; G06F 3/0634
USPC ......... 713/320, 300, 330; 365/227, 226, 194
See application file for complete search history.

(56) References Cited

U.S. PATENT DOCUMENTS

| | | | |
|---|---|---|---|
| 7,376,854 B2 | 5/2008 | Lehwalder | |
| 7,890,804 B2 | 2/2011 | Mann | |
| 8,374,049 B2 | 2/2013 | Liu | |
| 8,743,653 B1 | 6/2014 | Narayanan | |
| 8,928,351 B1 | 1/2015 | Konduru | |
| 9,098,270 B1 | 8/2015 | Tiyyagura | |
| 9,268,901 B1 | 2/2016 | Sood | |
| 9,424,896 B2 | 8/2016 | Groot | |
| 2006/0250877 A1* | 11/2006 | Smith | G11C 7/22 365/229 |
| 2013/0135945 A1 | 5/2013 | Liu | |
| 2016/0011652 A1 | 1/2016 | Sadowski | |
| 2017/0052727 A1* | 2/2017 | Sauber | G06F 1/3225 |

* cited by examiner

*Primary Examiner* — Hong C Kim
(74) *Attorney, Agent, or Firm* — FSP LLC

(57) ABSTRACT

A sequential delay mechanism is provided for a memory subsystem of a host system. A first independent SAVE region of NVDIMMs of the memory subsystem is configured to start a memory SAVE immediately upon receiving a SAVE signal from the host system, and other independent SAVE regions of the NVDIMMs are configured to implement the delay mechanism. A memory SAVE to the NVDIMMs is activated immediately in the first independent SAVE region when the SAVE signal is received, and the other independent SAVE regions sequentially delay their activation of the memory SAVE.

6 Claims, 4 Drawing Sheets

EXTENDING THE TIME FOR A MEMORY SAVE OPERATION BY REDUCING THE PEAK INSTANTANEOUS CURRENT DRAW

BRIEF SUMMARY

Disclosed herein are circuits and other logic to reduce the current draw from a battery by extending the total time for a memory SAVE operation, so that more energy can be extracted from the battery. By reducing the peak instantaneous current draw and the total energy extracted from the battery, it is also possible to prevent a deep discharge of the battery which can shorten battery life.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
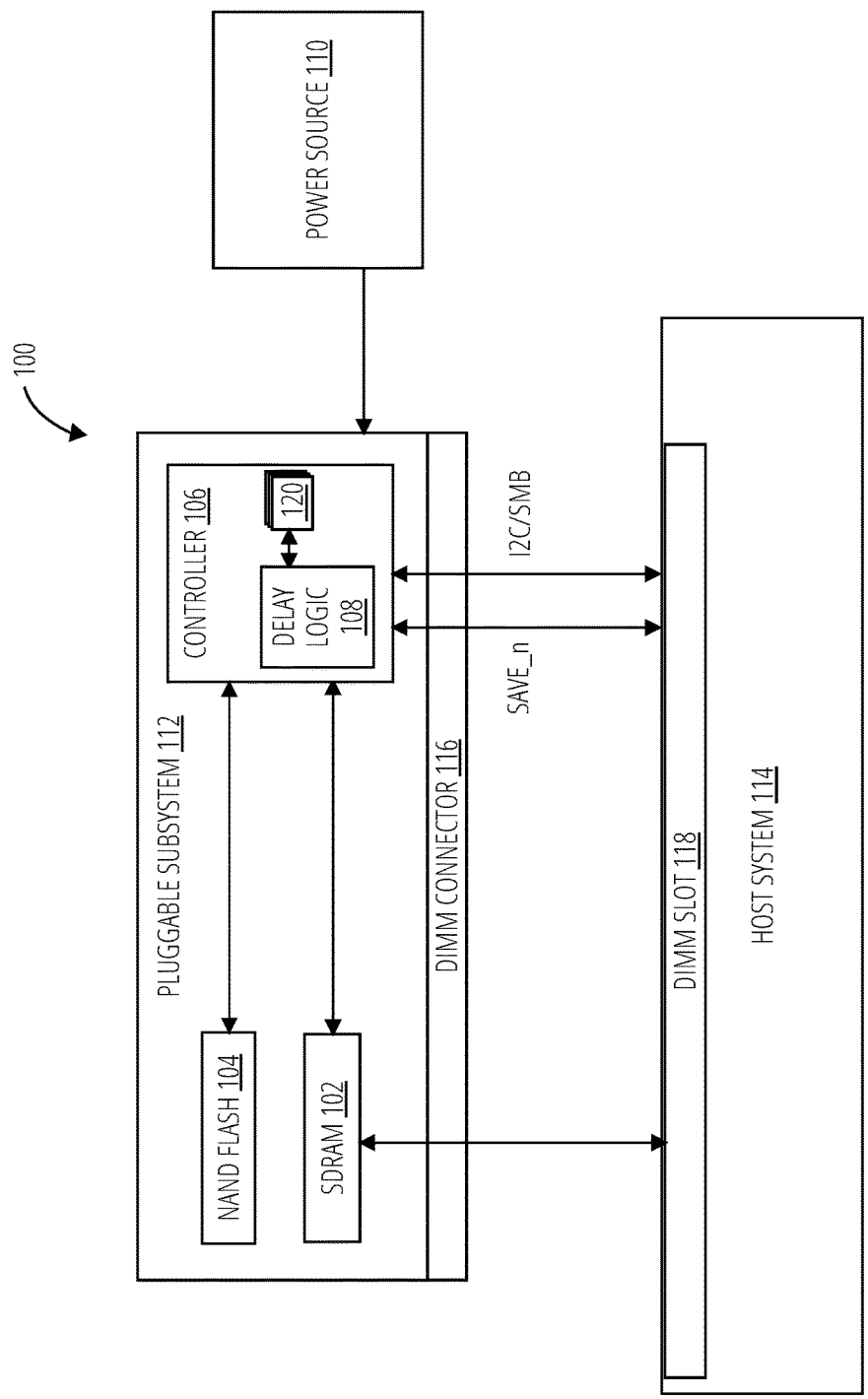
FIG. 1 illustrates a memory system 100 in accordance with one embodiment.

"Bank" in this context refers to a region of memory that is configurable to operate a SAVE operation independently of other regions not in the bank. A bank may for example refer to an entire non volatile memory module or set of modules.

"Configured duration" in this context refers to a value stored in a re-writable memory that is applied to control a timer circuit.

"Host system" in this context refers to a machine into which a memory subsystem is inserted and which utilizes the memory subsystem to store software logic.

"Low power" in this context refers to a mode of operation in which non-volatile memory draws enough current to preserve its logic content, but which is much less power than required to perform a SAVE operation on the non-volatile memory.

"Maximum SAVE time" in this context refers to the longest time that any independent SAVE region (a.k.a. 'bank') of non-volatile memory in a memory subsystem will require to perform a SAVE.

Embodiments of a memory system and process are disclosed to reduce the NVDIMM current consumption peak flow by compromising memory backup execution time and increasing total energy draw from the batteries, which counterintuitively, may make the NVDIMMs more conducive for use with certain energy sources. Selected independent SAVE regions of the NVDIMMs are are configured to sequentially delay their SAVE (backup) operation and to operate in a low power self-refresh mode during the time they are waiting. The total energy required to complete the SAVE increases, due to the need to maintain the delayed NVDIMMs in self-refresh until they initiate the SAVE.

The delay mechanism may be controlled by a host system or the memory system, for example as part of a memory backup arming mechanism. The NVDIMMs may be divided logically into two or more independent SAVE regions of NVDIMMs. One such region (e.g., bank) is designated to start the SAVE immediately upon receiving a SAVE signal (the signal used to activate a memory SAVE), while the other independent SAVE regions are subject to one of the delay mechanisms disclosed herein.

In one option, NVDIMMs in the other independent SAVE regions delay the start of the memory SAVE by a configured duration, e.g., a multiple of a maximum SAVE time, which effectively staggers their SAVE start times. The maximum SAVE time can be determined and applied to the other independent SAVE regions as a rolling offset value, and stored as a preconfigured value in the logic of the memory subsystem or host system. A disadvantage of this mechanism is that there may be "dead" time between the completion of the SAVE by one bank and the start of the SAVE by the next bank, resulting in wasted power consumption by the memory subsystem due to maintaining the delayed banks in a memory refresh mode.

In another option, the NVDIMMs in one bank start their SAVE immediately when the SAVE signal occurs (SAVE). The NVDIMMs in the other independent SAVE regions monitor the SAVE pin and initiate their SAVE when the SAVE pin transitions, e.g., goes from low to high (indicating the prior independent SAVE regions in the sequence have completed their SAVEs).

In either of these options, the host may write to control registers of the memory subsystem to designate the independent SAVE regions as immediate SAVE or delayed SAVE, and to indicate which option of delaying the SAVE to execute.

FIG. 1 illustrates a memory system 100 in accordance with one embodiment. The memory system 100 comprises a pluggable subsystem 112 that includes an SDRAM 102, a NAND Flash 104, and a controller 106 comprising delay logic 108. The pluggable subsystem 112 is operated from a battery power source 110.

The pluggable subsystem 112 is installed into a host system 114. The pluggable subsystem 112 and host system 114 interact via a DIMM connector 116 and a DIMM slot 118. The host system 114 applies a SAVE signal to the controller 106 of the pluggable subsystem 112 via the DIMM connector 116 pins in the DIMM slot 118, initiating a SAVE (backup) of data stored in the SDRAM 102 to independent SAVE regions (e.g., banks) of the NAND Flash 104. Although SDRAM and NAND Flash are shown for the memory technologies, other memory types or subtypes known in the art may be utilized for these memory components.

The delay logic 108 may operate to introduce sequential delays into the SAVE operation by particular independent SAVE regions of the NAND Flash 104, as configured by the control registers 120. The control registers 120 are configured by the host system 114 to implement a particular delay mechanism. For example, the control registers 120 may configure the delay logic 108 to operate a timer to serialize delay by a plurality of independent SAVE regions of the NAND Flash 104, and/or configure the delay logic 108 to monitor a SAVE pin of the DIMM connector 116 to serialize saving by the plurality of independent SAVE regions.

Figure 2:
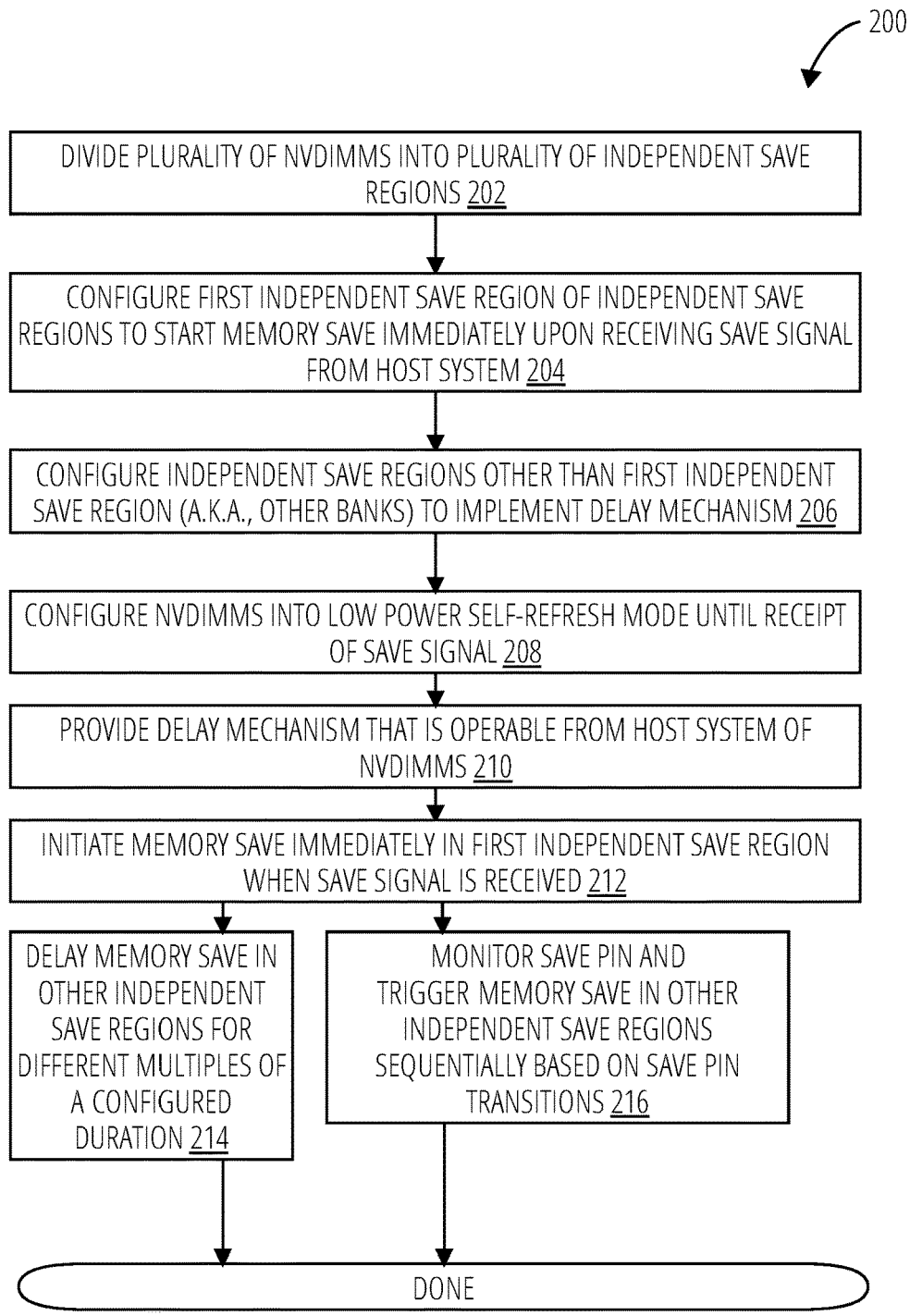
FIG. 2 illustrates a memory SAVE management process 200 in accordance with one embodiment.
Figure 3:
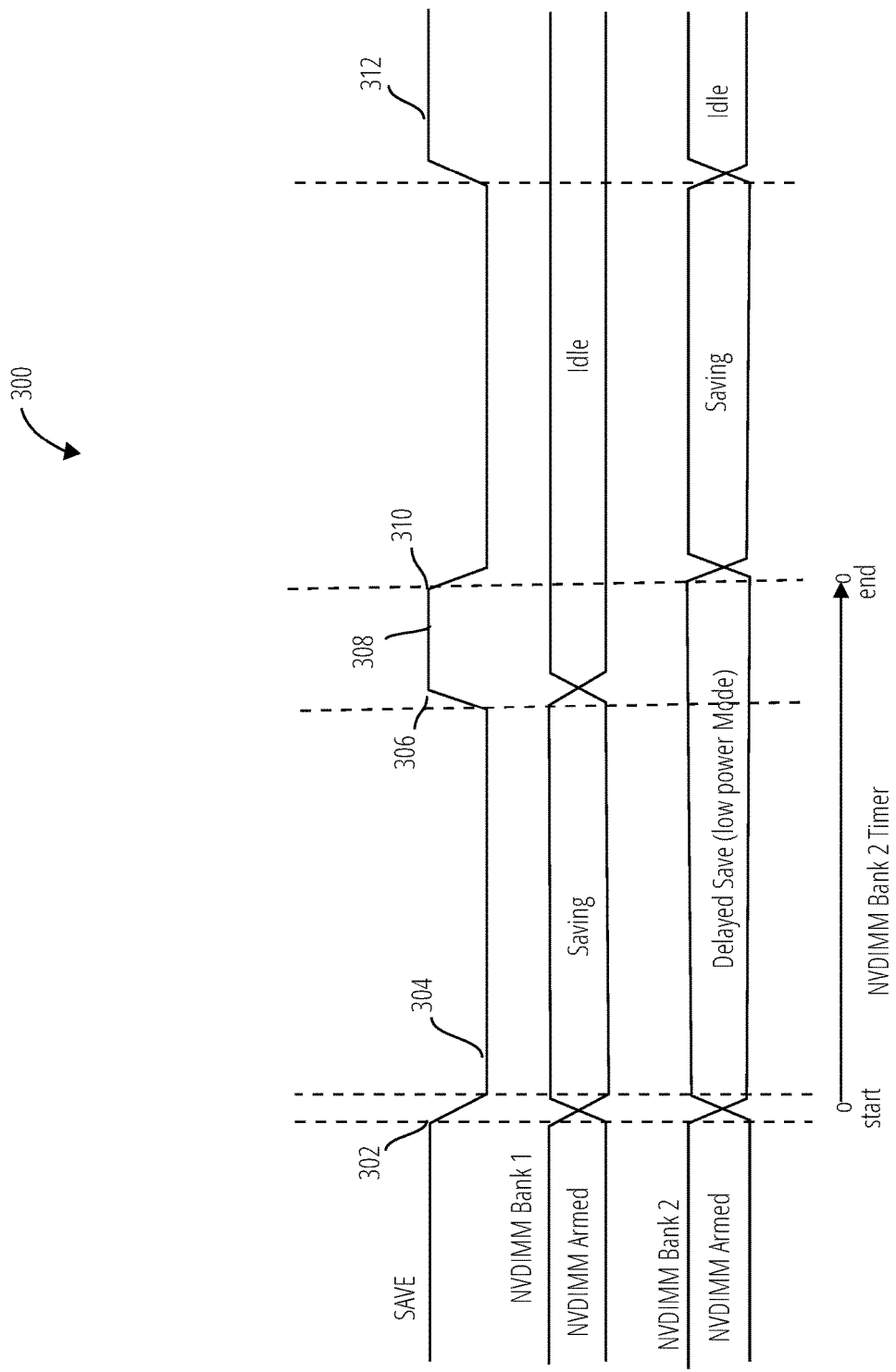
FIG. 3 illustrates a signal timing diagram 300 for a memory SAVE operation in accordance with two embodiments.
Figure 4:
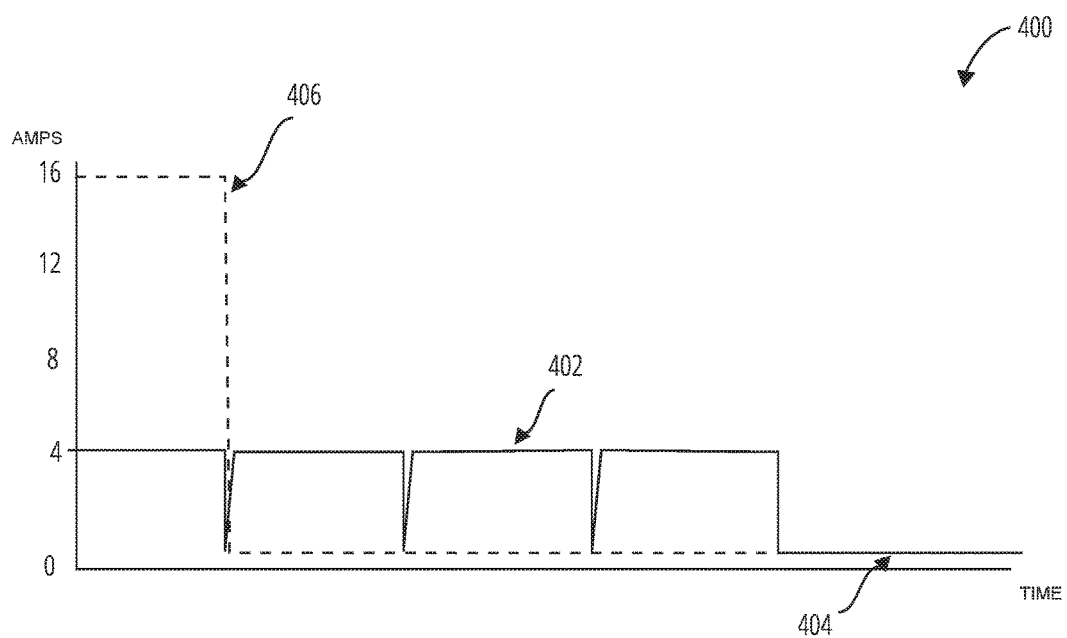
FIG. 4 illustrates a comparison of conventional and modified SAVE current profiles 400 in accordance with one embodiment.

The memory system 100 may be operated according to the memory SAVE management process 200 of FIG. 2, and the signal timing diagram 300 of FIG. 3, resulting in a current profile as illustrated, for example, in FIG. 4.

FIG. 2 illustrates a memory SAVE management process 200 in accordance with one embodiment. Broadly, the process 200 includes an initialization phase and a SAVE phase.

Initialization:
Divide NVDIMMs into banks/regions;
Configure one region for "immediate" SAVE;
Configure other regions with appropriate delay mechanism(s);
SAVE:
Receive SAVE signal;
Configure NVDIMMs into low power state;
Begin SAVE of "immediate" region;
Sequentially SAVE other regions.

In block 202, divide a plurality of NVDIMMs into a plurality of independent SAVE regions. To configure for delayed SAVE, in block 204, configure a first independent SAVE region of the independent SAVE regions to start a memory SAVE immediately upon receiving a SAVE signal from the host system. In block 206, configure independent SAVE regions other than the first independent SAVE region (other banks) to implement the delay mechanism. In block 208, configure the NVDIMMs into a low power self-refresh mode until receipt of a SAVE signal. In block 210, provide a delay mechanism that is operable from a host system of the NVDIMMs.

Delayed SAVE then may take place. In block 212, initiate the memory SAVE immediately in the first independent SAVE region when the SAVE signal is received. Two different modes of delayed SAVE are then possible.

In block 214, delay the memory SAVE in the other independent SAVE regions for a configured duration (e.g., In delay the memory SAVE by each of the other independent SAVE regions by a multiple of a maximum SAVE time to stagger their SAVE start times.) In block 216, monitor a SAVE pin and trigger the memory SAVE in the other independent SAVE regions sequentially, based on transitions of the SAVE pin, e.g., when the SAVE pin transitions from low to high. One or the other mode of delay mechanism will typically be selected, although embodiments may exist in which the modes are selectively mixed among the other memory independent SAVE regions.

FIG. 3 illustrates a signal timing diagram 300 for a memory SAVE operation in accordance with two embodiments.

At time t1 302, the host system 114 drives SAVE_n (the SAVE signal on the SAVE pin) low to initiate a SAVE operation in the memory system 100. At time t2 304, NVDIMM bank 1 drives SAVE_n low to indicate the SAVE operation is under way. At time t3 306, NVDIMM bank 1 releases SAVE_n (lets the signal line transition high), to indicate the SAVE operation is complete. During the time interval I1 308, when neither NVDIMM bank 1 or NVDIMM bank 2 are saving, there are two options. In one option, NVDIMM bank 2 waits for a timer to expire before starting the SAVE. In another option, NVDIMM bank 2 waits for SAVE_n to transition high before starting to SAVE.

At a time t4 310, NVDIMM bank 2 drives SAVE_n low to indicate the Save operation is under way. At a time t5 312, NVDIMM bank 1 and NVDIMM bank 2 have both completed Saving and SAVE_n is released to transition high.

Thus, as shown, a SAVE operation may be serialized across non-volatile memory independent SAVE regions, either by control of a SAVE pin or using a timer.

FIG. 4 illustrates a comparison of conventional and modified SAVE current profiles 400 in accordance with one embodiment. A conventional current profile 406 draws a large current (e.g., 16 A) for a short period of time during a SAVE, when all non-volatile memory banks are SAVING in parallel. Whereas a modified current profile has a much lower SAVE current 402 (e.g., approximately 4 A for the SAVING bank, plus 0.4 A for the low power mode current 404 of the non-SAVING memory banks).

The memory systems and processes disclosed herein may be implemented using a combination of hardware, software, and/or firmware. For example, the controller 106 may be implemented as a hardware integrated circuit chip, or as a programmable device that includes hardware and some firmware. Those skilled in the art will readily appreciate that various well known circuitry may be utilized to interoperate the various components (busses, delay buffers, synchronizing circuits, clocks, etc.). In some embodiments, the SAVE algorithms may be implemented as software stored in memory of the host system 114 or pluggable subsystem 112, and thus provide maximum flexibility for updating to subsequent versions or additions.

Terms used herein should be accorded their ordinary meaning in the relevant arts, or the meaning indicated by their use in context, but if an express definition is provided, that meaning controls.

"Circuitry" in this context refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

"Firmware" in this context refers to software logic embodied as processor-executable instructions stored in read-only memories or media.

"Hardware" in this context refers to logic embodied as analog or digital circuitry.

"Logic" in this context refers to machine memory circuits, non transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

"Programmable device" in this context refers to an integrated circuit designed to be configured and/or reconfigured after manufacturing. The term "programmable processor" is another name for a programmable device herein. Programmable devices may include programmable processors, such as field programmable gate arrays (FPGAs), configurable hardware logic (CHL), and/or any other type programmable devices. Configuration of the programmable device is generally specified using a computer code or data such as a hardware description language (HDL), such as for example Verilog, VHDL, or the like. A programmable device may include an array of programmable logic blocks and a hierarchy of reconfigurable interconnects that allow the programmable logic blocks to be coupled to each other according to the descriptions in the HDL code. Each of the programmable logic blocks may be configured to perform complex combinational functions, or merely simple logic gates, such as AND, and XOR logic blocks. In most FPGAs, logic blocks also include memory elements, which may be simple latches, flip-flops, hereinafter also referred to as "flops," or more complex blocks of memory. Depending on the length of the interconnections between different logic blocks, signals may arrive at input terminals of the logic blocks at different times.

"Software" in this context refers to logic implemented as processor-executable instructions in a machine memory (e.g. read/write volatile or nonvolatile memory or media).

Herein, references to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. Any terms not expressly defined herein have their conventional meaning as commonly understood by those having skill in the relevant art(s).

Various logic functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

Those skilled in the art will recognize that it is common within the art to describe devices or processes in the fashion set forth herein, and thereafter use standard engineering practices to integrate such described devices or processes into larger systems. At least a portion of the devices or processes described herein can be integrated into a network processing system via a reasonable amount of experimentation. Various embodiments are described herein and presented by way of example and not limitation.

Those having skill in the art will appreciate that there are various logic implementations by which processes and/or systems described herein can be effected (e.g., hardware, software, or firmware), and that the preferred vehicle will vary with the context in which the processes are deployed. If an implementer determines that speed and accuracy are paramount, the implementer may opt for a hardware or firmware implementation; alternatively, if flexibility is paramount, the implementer may opt for a solely software implementation; or, yet again alternatively, the implementer may opt for some combination of hardware, software, or firmware. Hence, there are numerous possible implementations by which the processes described herein may be effected, none of which is inherently superior to the other in that any vehicle to be utilized is a choice dependent upon the context in which the implementation will be deployed and the specific concerns (e.g., speed, flexibility, or predictability) of the implementer, any of which may vary. Those skilled in the art will recognize that optical aspects of implementations may involve optically-oriented hardware, software, and or firmware.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein. The techniques and procedures described herein may be implemented via logic distributed in one or more computing devices. The particular distribution and choice of logic will vary according to implementation.

The foregoing detailed description has set forth various embodiments of the devices or processes via the use of block diagrams, flowcharts, or examples. Insofar as such block diagrams, flowcharts, or examples contain one or more functions or operations, it will be understood as notorious by those within the art that each function or operation within such block diagrams, flowcharts, or examples can be implemented, individually or collectively, by a wide range of hardware, software, firmware, or virtually any combination thereof. Portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more processing devices (e.g., as one or more programs running on one or more computer systems), as one or more programs running on one or more processors (e.g., as one or more programs running on one or more microprocessors), as firmware, or as virtually any combination thereof, and that designing the circuitry or writing the code for the software or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, flash drives, SD cards, solid state fixed or removable storage, and computer memory.

In a general sense, those skilled in the art will recognize that the various aspects described herein which can be implemented, individually or collectively, by a wide range of hardware, software, firmware, or any combination thereof can be viewed as being composed of various types of circuitry.

What is claimed is:
1. A memory subsystem comprising:
a plurality of non-volatile dual in-line memory modules (NVDIMMs) configured into a plurality of independent SAVE regions;
a delay mechanism that is operable from a host system of the plurality of NVDIMMs;

logic to configure independent SAVE regions other than a first independent SAVE region to implement the delay mechanism; and logic to configure the first independent SAVE region to initiate a memory SAVE immediately when a SAVE signal is received;

wherein the delay mechanism is one or more of:

delaying the memory SAVE by one or more of the other independent SAVE regions each by a different multiple of a configured duration to stagger a SAVE start time of each of the other independent SAVE regions; and monitoring a SAVE pin and triggering the memory SAVE in the other independent SAVE regions when the SAVE pin transitions from low to high.

2. The memory subsystem of claim 1, further comprising:
logic to configure the plurality of independent SAVE regions into a low power self-refresh mode until receipt of the SAVE signal.

3. The memory subsystem of claim 1, wherein the configured duration is a maximum SAVE time for the plurality of independent SAVE regions.

4. A method comprising:

dividing a plurality of non-volatile dual in-line memory modules (NVDIMMs) into a plurality of independent SAVE regions;

configuring a first independent SAVE region of the plurality of independent SAVE regions to start a memory SAVE immediately upon receiving a SAVE signal from a host system;

providing a delay mechanism that is operable from the host system;

of the plurality of NVDIMMs;

configuring independent SAVE regions other than the first independent SAVE region to implement the delay mechanism; and initiating the memory SAVE immediately in the first independent SAVE region when the SAVE signal is received;

wherein the delay mechanism is one or more of:

delaying the memory SAVE by one or more of the other independent SAVE regions each by a different multiple of a configured duration to stagger a SAVE start time of each of the other independent SAVE regions; and monitoring a SAVE pin and triggering the memory SAVE in the other independent SAVE regions when the SAVE pin transitions from low to high.

5. The method of claim 4, further comprising:

configuring the plurality of independent SAVE regions into a low power self-refresh mode until receipt of the SAVE signal.

6. The method of claim 4, wherein the configured duration is a maximum SAVE time for the plurality of independent SAVE regions.

\* \* \* \* \*